United States Patent [19]
Yamashita et al.

[11] Patent Number: 5,973,953
[45] Date of Patent: Oct. 26, 1999

[54] SEMICONDUCTOR MEMORY DEVICE HAVING IMPROVED BIT LINE STRUCTURE

[75] Inventors: Takekazu Yamashita, Nagasaki; Kiyoyuki Shiroshima, Hyogo; Michio Nakajima; Makoto Hatakenaka, both of Tokyo; Hideki Toki, Hyogo; Tuyoshi Saitoh, Nagasaki, all of Japan

[73] Assignees: Mitsubishi Electric System LSI Design Corporation, Hyogo; Mitsubishi Denki Kabushiki Kaisha, Tokyo, both of Japan

[21] Appl. No.: 09/038,278

[22] Filed: Mar. 11, 1998

[30] Foreign Application Priority Data

Sep. 18, 1997 [JP] Japan ................................ 9-253806

[51] Int. Cl.⁶ ............................................ G11C 5/06
[52] U.S. Cl. ................................... 365/63; 365/149
[58] Field of Search ............................ 365/63, 149, 51

[56] References Cited

U.S. PATENT DOCUMENTS 5,416,734  5/1995  Hidaka et al. ........................... 365/63

FOREIGN PATENT DOCUMENTS

| 61-206254 | 9/1986 | Japan . |
|---|---|---|
| 64-76494 | 3/1989 | Japan . |
| 2146769 | 6/1990 | Japan . |
| 435063 | 2/1992 | Japan . |
| 494569 | 3/1992 | Japan . |
| 4226070 | 8/1992 | Japan . |
| 5167030 | 7/1993 | Japan . |

*Primary Examiner*—David Nelms
*Assistant Examiner*—David Lam
*Attorney, Agent, or Firm*—Leydig, Voit & Mayer, Ltd.

[57] ABSTRACT

A semiconductor memory device is constituted such that, when a first wiring layer provides a bit line of a first common complementary data line pair and a third wiring layer provides a bit line of a second common complementary data line pair, a second wiring layer makes an overlapped area between the bit line and the bit bar line of the second common complementary dada line pair equal to the bit line of the first common complementary data line pair and also an overlapped area between the bit line and the bit bar line of the first common complementary data line pair equal to the bit line of the second common complementary data line pair.

10 Claims, 12 Drawing Sheets

SEMICONDUCTOR MEMORY DEVICE HAVING IMPROVED BIT LINE STRUCTURE

BACKGROUND OF THE INVENTION

1. Field of the Invention

The present invention generally relates to a semiconductor memory device and, more particularly, to a pair of adjacent common complementary data lines, namely the wiring between a pair of global I/O lines.

2. Description of Prior Art

Figure 12:
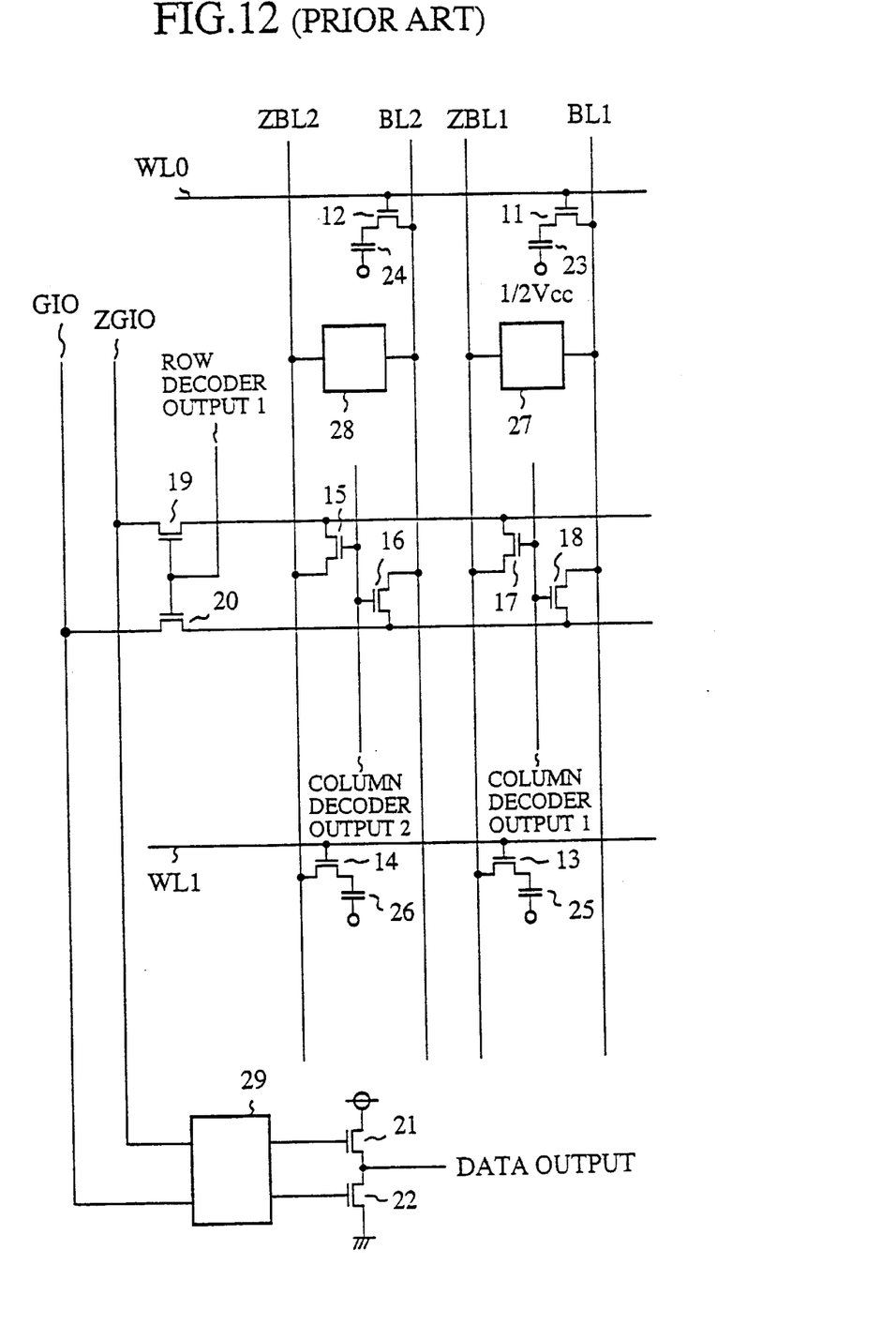
FIG. 12 is a general circuit diagram illustrating a conventional semiconductor memory device.

Referring to FIG. 12, there is shown a circuit diagram (for a reading operation in this case) illustrating a memory array of a conventional semiconductor memory device and its peripheral circuits. In the drawing, reference numerals 11 through 14 denote memory cell transistors, reference numerals 15 through 20 denote switching transistors for row decoding, reference numerals 21 and 22 denote output transistors (main amplifiers), reference numerals 23 through 26 denote memory cell capacitors, reference numerals 27 and 28 denote sense amplifiers, reference numeral 29 denotes an output preamplifier, reference symbols BL1 and BL2 denote bit lines, reference symbols ZBL1 and ZBL2 denote bit bar lines, reference symbol GIO denotes a global I/O line, reference symbol ZGIO denotes a global I/O bar line, and reference symbols WL0 and WL1 denote word lines. The BL1 and the ZBL1 are paired and the BL2 and the ZBL2 are paired. The GIO and the ZGIO are paired in global I/O line. The switch transistors 15 through 20 constitute selector switches.

The following describes the operation of the above-mentioned conventional semiconductor memory device.

A bit line selected at reading a device using a memory cell of one-transistor type such as shown in FIG. 12 is connected one of the pair of global I/O lines through the row decoder switching transistors 15 to 20. At this moment, because the common data I/O line possibly gives a noise to the bit line pair, the row decoder starts operating after the sense amplifiers 27 and 28 detect an infinitesimal signal and amplifies the detected signal. Information read from the bit line is supplied to the global I/O line pair connected by the switch transistors 15 through 20, the supplied information is amplified by the output preamplifier 29, and the amplified information is transmitted by the output transistors (main amplifiers) 21 and 22.

Figures 13, 14:
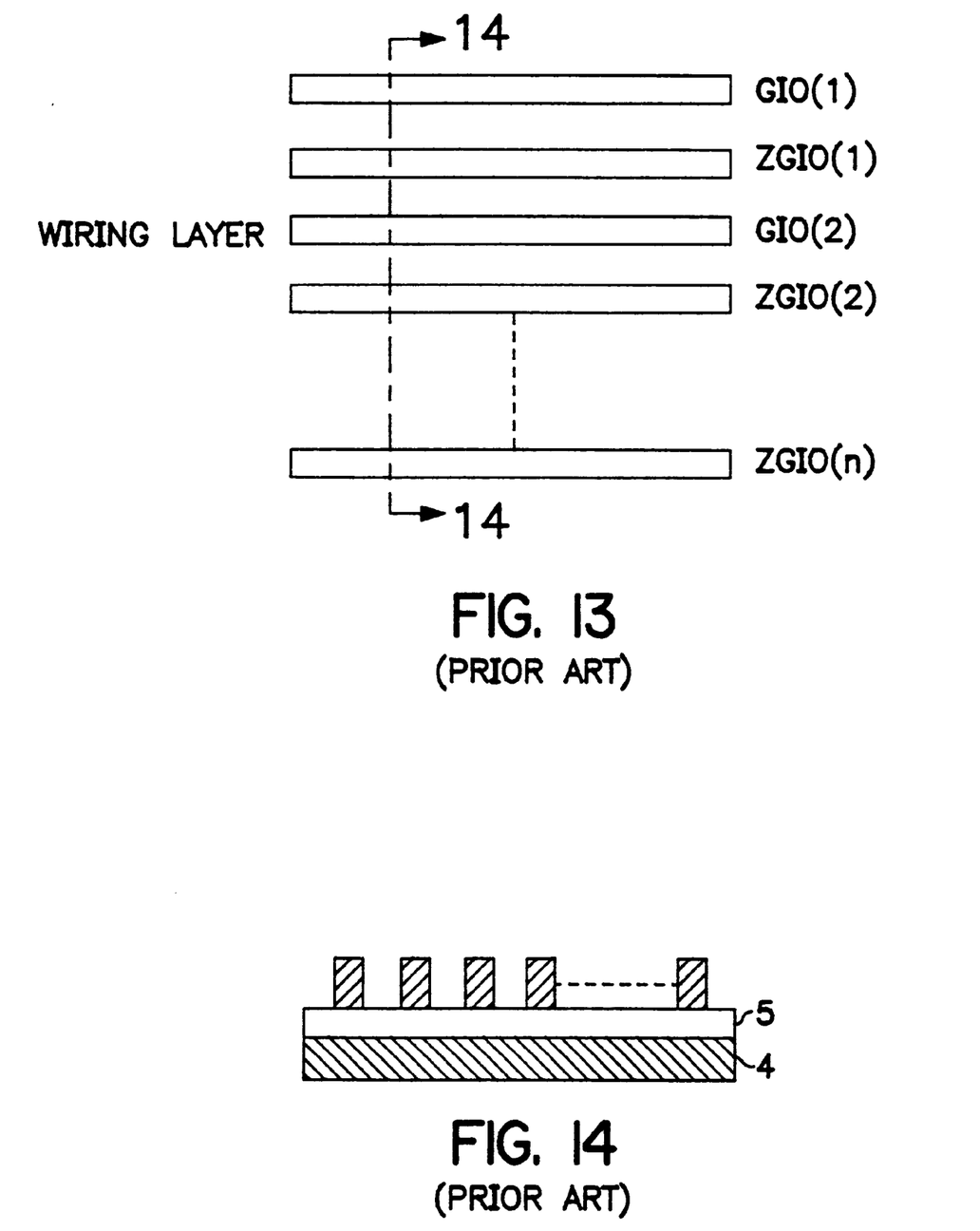
FIG. 13 is a plan view illustrating the conventional semiconductor memory device.
FIG. 14 is a cross sectional view illustrating the conventional semiconductor memory device.

Referring to FIG. 13, there is shown a plan view illustrating the common complementary data pair namely the global I/O line pair of the conventional semiconductor memory device. Referring to FIG. 14, there is shown a cross section of the wiring layer of FIG. 13 along line 14—14. In the drawing, reference numeral 4 denotes a semiconductor substrate, reference numeral 5 denotes an insulation layer such as a field oxide film, and reference symbols GIO(n) and ZGIO(n) denote a global I/O line (n) and a global I/O bar line (n) respectively which constitute a global I/O line pair (n) (n being a natural number). If one of the GIO(n) and the ZGIO(n) is a bit line, the other is a bit bar line. Namely, a GIO(1) and a ZGIO(1) constitute a global I/O pair (1) and a GIO(2) and a ZGIO(2) constitute a global I/O line pair (2).

In the conventional example, a single wiring layer is used for the bit line and the bit bar line of the global I/O line pair (n) as shown in FIGS. 13 and 14. This global I/O line pair (n) is connected via a selector switch for selecting one of a plurality of bit lines to be connected to a plurality of memory cells.

Figure 15:
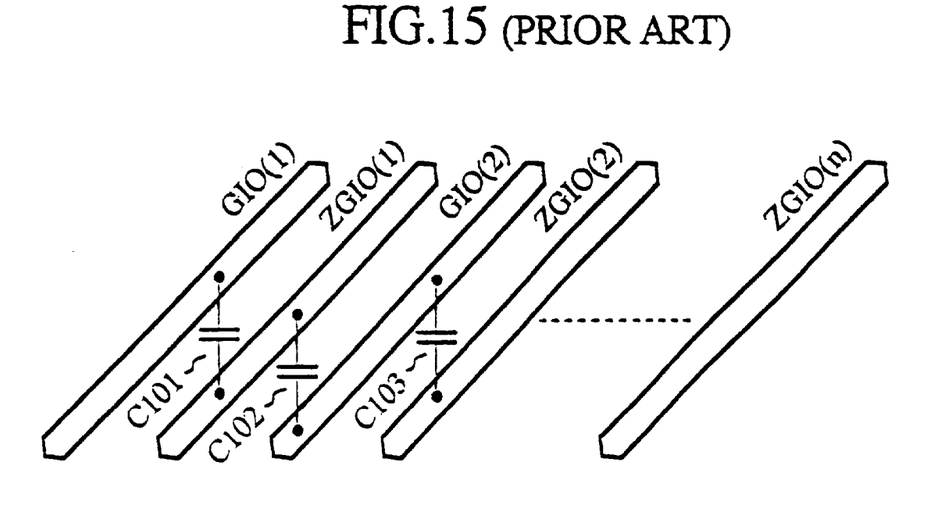
FIG. 15 is a perspective view illustrating the conventional semiconductor memory device.

Referring to FIG. 15, there is shown a diagram illustrating the coupling capacitors between wirings of the bit line GIO(1) and the bit bar line ZGIO(1) of the global I/O line pair (1) and the bit line GIO(2) and the bit bar line ZGIO(2) of the global I/O line pair (2). In the drawing, C101 denotes the coupling capacitor between the bit line GIO(1) and the bit bar line ZGIO(1), C102 denotes the coupling capacitor between the bit bar line ZGIO(1) and the bit line GIO(2), and C103 denotes the coupling capacitor between the bit line GIO(2) and the bit bar line ZGIO(2).

Figure 16:
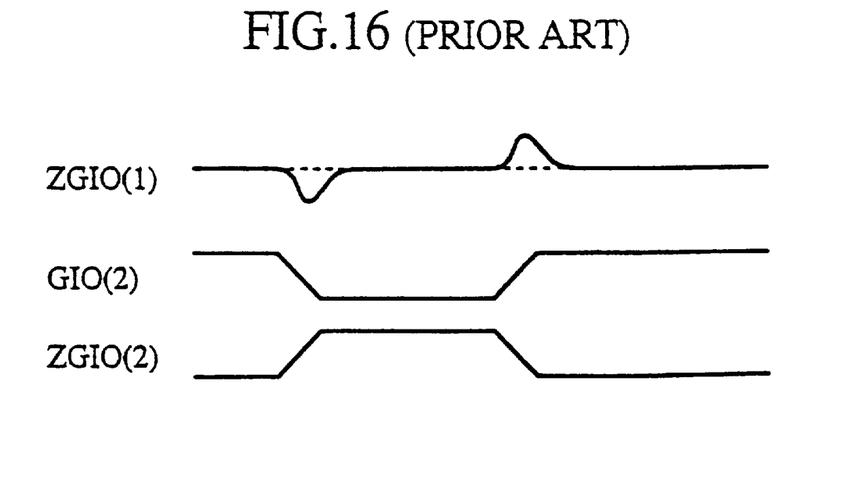
FIG. 16 is a diagram illustrating a correlation between wiring potentials of the conventional semiconductor memory device.

Referring to FIG. 16, there is shown a diagram illustrating an influence of the coupling capacitor C102 between the bit bar line of the global I/O line pair (1) and the bit line of the global I/O line pair (2) shown in FIG. 15 to be given to the potential of the bit bar line of the global I/O line pair (1) relative to the potential variation of the bit line of the global I/O line pair (2).

The following describes the operation of the above-mentioned conventional constitution.

The bit bar line ZGIO(1) of the global I/O line pair has the coupling capacitor C102 with the bit line GIO(2) of the global I/O line pair (2). When the potential of the bit line GIO(2) of the global I/O line pair (2) changes, the bit bar line ZGIO(1) of the global I/O line pair (1) is influenced by the rise (at changing of the bit line potential of the global I/O line pair (2) from low to high) and the fall (at changing of the bit line potential of the global I/O line pair (2) from high to low) in the bit line potential of the global I/O line pair (2) by the coupling capacitor between the bit lines. This influence interferes with the operation of the bit bar line ZGIO(1) of the global I/O line pair (1). This holds true with the influence to be given by the potential change of the bit bar line ZGIO(1) of the global I/O line pair (1) to the bit line potential of the global I/O line pair (2).

Therefore, in order to protect the bit bar line ZGIO(1) of the global I/O line pair (1) from being influenced by the bit line GIO(2) of the global I/O line pair (2) and the bit line GIO(2) of the global I/O line pair (2) from being influenced by the bit bar line ZGIO(1) of the global I/O line pair (1), the wiring pitch between the bit line GIO(n) and the bit bar line ZGIO(n) must be widened. However, if the wiring pitch is widened, it prevents the efficiency of wiring area from being enhanced, which imposes a problem to the future trend of narrower wiring pitches required by ever higher device integration.

SUMMARY OF THE INVENTION

Since the conventional semiconductor memory device is constituted as described above, if the number of global I/O pairs must be required as the bus gets wider, the wiring layout can take only a form of lateral layout. This poses a problem of increasing the device size since a certain space must be provided between wirings to avoid adverse influence due to noise interference.

Moreover, in the conventional global I/O line pair constitution, only a particular, namely one, line-to-line capacitor can be provided for each wiring, so that the global I/O line pairs are susceptible to noise.

The present invention has been implemented to solve the above-mentioned problems, and it is therefore an object of the present invention to provide a semiconductor memory device that mitigates noise interference between the adjacent global I/O lines by use of multilayer wiring and enhances the efficiency of wiring area to implement space saving.

In carrying out the invention and according to a first aspect thereof, there is provided a semiconductor memory device comprising: a complementary data line composed of a bit line connected to a plurality of memory cells and a bit bar line; a first wiring layer, a second wiring layer, and a third wiring layer sequentially formed on a semiconductor substrate; a first common complementary data line pair composed of a bit line and a bit bar line with the first wiring layer connected to the second wiring layer by a first via contact; a second common complementary data line pair composed of a bit line and a bit bar line with the second wiring layer connected to the third wiring layer by a second via contact; and a selector switch for selecting the bit line and the bit bar line of the complementary data line to interconnect the bit lines of the first common complementary data line pair and the second common complementary data line pair and interconnect the bit bar lines thereof; wherein, when the first wiring layer provides the bit line of the first common complementary data line pair and the third wiring layer provides the bit line of the second common complementary data line pair, the second wiring layer makes an overlapped area between the bit line and the bit bar line of the second common complementary data line pair equal to the bit line of the first common complementary data line pair and an overlapped area between the bit line and the bit bar line of the first common complementary data line pair equal to the bit line of the second common complementary data line pair.

According to the above-mentioned first aspect, the coupling capacitors between the bit line of the first common complementary data line pair and the bit line and the bit bar line of the second common complementary data line pair can be made equal to each other and the coupling capacitors between the bit bar line of the first common complementary data line pair and the bit line and the bit bar line of the second common complementary data line pair can also be made equal to each other.

In this novel constitution, if the bit line of the first common complementary data line pair is influenced in potential by the coupling capacitor between the bit line of the first common complementary data line pair and the bit line of the second common complementary data line pair when the potential level of the bit line of the second common complementary data line pair changes (from low to high), the potential level of the bit bar line of the adjacent second common complementary data line pair conversely changes (from high to low) at the same time, so that the bit line of the first common complementary data line pair is conversely influenced in potential by the coupling capacitor between the bit line of the first common complementary data line pair and the bit bar line of the second common complementary data line pair. Consequently, the influence in potential to the bit line of the first common complementary data line pair is offset, thereby mitigating the influence due to noise.

In addition, use of multilayer metal wiring such as the first wiring layer through the third wiring layer reduces a wiring layout occupation area.

In carrying out the invention and according to a second aspect thereof, there is provided a semiconductor memory device comprising: a complementary data line composed of a bit line connected to a plurality of memory cells and a bit bar line; a first wiring layer, a second wiring layer, and a third wiring layer sequentially formed on a semiconductor substrate; a first common complementary data line pair composed of a bit line and a bit bar line with the first wiring layer connected to the second wiring layer by a first via contact; a second common complementary data line pair composed of a bit line and a bit bar line with the second wiring layer connected to the third wiring layer by a second via contact; and a selector switch for selecting a bit line and a bit bar line of the complementary data line to establish connection of bit lines and bit bar lines of the first and second common complementary data line pairs; wherein, when the first wiring layer provides the bit bar line of the first common complementary data line pair and the third wiring layer provides the bit bar line of the second common complementary data line pair, the second wiring layer makes the overlapped area between the bit line and the bit bar line of the second common complementary data line pair equal to the bit bar line of the first common complementary data line pair and the overlapped area between the bit line and the bit bar line of the first common complementary data line pair equal to the bit bar line of the second common complementary data line pair.

According to the above-mentioned second aspect, the coupling capacitors between the bit bar line of the first common complementary data line pair and the bit line and the bit bar line of the second common complementary data line pair can be made equal to each other and the coupling capacitors between the bit line of the first common complementary data line pair and the bit line and the bit bar line of the second common complementary data line pair can also be made equal to each other.

In this novel constitution, if the bit bar line of the first common complementary data line pair is influenced in potential by the coupling capacitor between the bit bar line of the first common complementary data line pair and the bit bar line of the second common complementary data line pair when the potential level of the bit bar line of the second common complementary data line pair changes (from low to high), the potential level of the bit line of the adjacent second common complementary data line pair conversely changes (from high to low) at the same time, so that the bit bar line of the first common complementary data line pair is conversely influenced in potential by the coupling capacitor between the bit bar line of the first common complementary data line pair and the bit line of the second common complementary data line pair. Consequently, the influence in potential to the bit bar line of the first common complementary data line pair is offset, thereby mitigating the influence due to noise.

In addition, use of multilayer metal wiring such as the first wiring layer through the third wiring layer reduces a wiring layout occupation area.

In carrying out the invention and according to a third aspect thereof, there is provided a semiconductor memory device comprising: a complementary data line composed of a bit line connected to a plurality of memory cells and a bit bar line; a first wiring layer, a second wiring layer, and a third wiring layer sequentially formed on a semiconductor substrate; a first common complementary data line pair composed of a bit line with the first wiring layer connected to the second wiring layer through a first via contact and a bit bar line formed by the first wiring layer; a second common complementary data line pair composed of a bit line with the second wiring layer connected to the third wiring layer through a second via contact and a bit bar line formed by the third wiring layer; and a selector switch for selecting a bit line and a bit bar line of the complementary data line to establish connection of bit lines and bit bar lines of the first and second common complementary data line pairs; wherein the first wiring layer and the second wiring layer make an overlapped area between the bit line and the bit bar line of the first common complementary data line pair and an area in which the bit line and the bit bar line are parallel to each other equal to the bit line of the second common complementary data line pair and the second wiring layer and the third wiring layer make an overlapped area between the bit line and the bit bar line of the second common complementary data line pair and an area in which the bit line and the bit bar line are parallel to each other equal to the bit line of the first common complementary data line pair.

According to the above-mentioned third aspect, the bit line of the first common complementary data line pair has coupling capacitors with the bit line and the bit bar line of the second common complementary data line pair and the bit line of the second common complementary data line pair also has coupling capacitors with the bit line and the bit bar line of the first common complementary data line pair.

In this novel constitution, if the bit line of the second common complementary data line pair is influenced in potential by the coupling capacitor between the bit line of the second common complementary data line pair and the bit line of the first common complementary data line pair when the potential level of the bit line of the first common complementary data line pair changes (from low to high), the bit bar line of the adjacent first common complementary data line pair conversely changes in potential (from high to low) at the same time, so that the bit line of the second common complementary data line pair is given the reverse potential by the coupling capacitor between the bit line of the second common complementary data line pair and the bit bar line of the first common complementary data line pair. Consequently, the potential influence to the bit line of the second common complementary data line pair is offset, thereby mitigating the influence due to noise.

In carrying out the invention and according to a fourth aspect thereof, there is provided a semiconductor memory device comprising: a complementary data line composed of a bit line connected to a plurality of memory cells and a bit bar line; a first wiring layer, a second wiring layer, and a third wiring layer sequentially formed on a semiconductor substrate; a first common complementary data line pair composed of a bit bar line with the first wiring layer connected to the second wiring layer through a first via contact and a bit line formed by the first wiring layer; a second common complementary data line pair composed of a bit bar line with the second wiring layer connected to the third wiring layer through a second via contact and a bit line formed by the third wiring layer; and a selector switch for selecting a bit line and a bit bar line of the complementary data line to establish connection of bit lines and bit bar lines of the first and second common complementary data line pairs; wherein the first wiring layer and the second wiring layer make an overlapped area between the bit line and the bit bar line of the first common complementary data line pair and an area in which the bit line and the bit bar line are parallel to each other equal to the bit bar line of the second common complementary data line pair and the second wiring layer and the third wiring layer make an overlapped area between the bit line and the bit bar line of the second common complementary data line pair and an area in which the bit line and the bit bar line is parallel to each other equal to the bit bar line of the first common complementary data line pair.

According to the above-mentioned fourth aspect, the bit bar line of the first common complementary data line pair has coupling capacitors with the bit line and the bit bar line of the second common complementary data line pair and the bit bar line of the second common complementary data line pair also has coupling capacitors with the bit line and the bit bar line of the first common complementary data line pair.

In this novel constitution, if the bit bar line of the second common complementary data line pair is influenced in potential by the coupling capacitor between the bit bar line of the second common complementary data line pair and the bit line of the first common complementary data line pair when the potential level of the bit line of the first common complementary data line pair changes (from low to high), the bit bar line of the adjacent first common complementary data line pair conversely changes in potential (from high to low) at the same time, so that the bit bar line of the second common complementary data line pair is given the reverse potential by the coupling capacitor between the bit bar line of the second common complementary data line pair and the bit bar line of the first common complementary data line pair. Consequently, the potential influence to the bit bar line of the second common complementary data line pair is offset, thereby mitigating the influence due to noise.

In carrying out the invention and according to a fifth aspect thereof, there is provided a semiconductor memory device comprising: a complementary data line composed of a bit line connected to a plurality of memory cells and a bit bar line; a first wiring layer, a second wiring layer, and a third wiring layer formed on a semiconductor substrate; a first common complementary data line pair with a bit line and a bit bar line allocated to the first wiring layer and a third wiring layer; a second common complementary data line pair with a bit line and a bit bar line allocated to the first wiring layer and a third wiring layer; and a selector switch for selecting a bit line and a bit bar line of the complementary data line to establish connection of bit lines and bit bar lines of the first and second common complementary data line pairs; wherein, when the first wiring layer is allocated to the bit lines of the first common complementary data line pair and the second common complementary data line pair and the third wiring layer is allocated to the bit bar lines of the first common complementary data line pair and the second common complementary data line pair, at least one of the first wiring layer and the third wiring layer that do not provide the bit line and the bit bar line is connected to the second wiring layer through a contact.

According to the above-mentioned fifth aspect, if the bit bar line of the first common complementary data line pair is influenced in potential by the coupling capacitor between the bit bar line of the first common complementary data line pair and the bit line of the second common complementary data line pair when the potential level of the bit line of the second common complementary data line pair changes (from low to high), the bit bar line of the adjacent second common complementary data line pair conversely changes in potential (from high to low) at the same time, so that the bit bar line of the first common complementary data line pair is given the reverse potential by the coupling capacitor between the bit bar line of the first common complementary data line pair and the bit bar line of the second common complementary data line pair. Consequently, the potential influence to the bit bar line of the first common complementary data line pair is offset, thereby mitigating the influence due to noise.

In carrying out the invention and according to a sixth aspect thereof, there is provided a semiconductor memory device wherein, when the first wiring layer is allocated to the bit bar lines of the first common complementary data line pair and the second common complementary data line pair and the third wiring layer is allocated to the bit lines of the first common complementary data line pair and the second common complementary data line pair, at one of the first wiring layer and the third wiring layer that do not provide the bit line and the bit bar line is connected to the second wiring layer through a contact.

According to the above-mentioned sixth aspect, the first wiring portion and the third wiring portion connected to the second wiring layer connected to a reference voltage and not providing signal wiring are arranged between the bit line and the bit bar line of the above-mentioned common complementary data line pair. This eliminates the coupling capacitor between these signal wirings and provides the coupling capacitors between the signals all with the reference voltage, thereby eliminating the influence of potential change to each signal wiring. Consequently, this invention is applicable to a circuit that operates on an infinitesimal potential as semiconductor memory devices come to operate on lower voltages.

In carrying out the invention and according to a seventh aspect thereof, there is provided a semiconductor memory device wherein, when the first wiring layer is allocated to the bit line of the first common complementary data line pair and the bit bar line of the second common complementary data line pair and the third wiring layer is allocated to the bit bar line of the first common complementary data line pair and the bit line of the second common complementary data line pair, at least one of the first wiring layer and the third wiring layer that do not provide the bit line and the bit bar line is connected to the second wiring layer through a contact.

According to the above-mentioned seventh aspect, the first wiring portion and the third wiring portion connected to the second wiring layer connected to a reference voltage and not providing signal wiring are arranged between the bit line and the bit bar line of the above-mentioned common complementary data line pair. This eliminates the coupling capacitor between these signal wirings and provides the coupling capacitors between the signals all with the reference voltage, thereby eliminating the influence of potential change to each signal wiring.

In carrying out the invention and according to an eighth aspect thereof, there is provided any of the above-mentioned the semiconductor memory devices further comprising a fourth wiring layer, a fifth wiring layer, and sixth wiring layer each having generally the same constitution as that of each of the first wiring layer, the second wiring layer, and the third wiring layer.

According to the eighth aspect, addition of the fourth wiring layer, the fifth wiring layer, and the sixth wiring layer reduces the wiring layout occupation area while providing the above-mentioned advantages.

BRIEF DESCRIPTION OF THE DRAWINGS

These and other objects and advantages of the invention may be readily ascertained by referring to the following description and appended drawings in which.

DETAILED DESCRIPTION OF PREFERRED EMBODIMENTS

This invention will be described in further detail by way of example with reference to the accompanying drawings.

EMBODIMENT 1

Figure 1A:
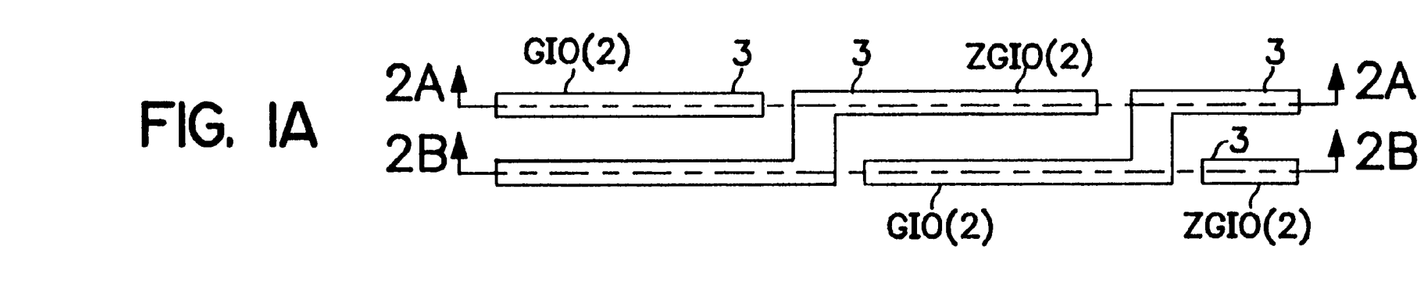
FIGS. 1A through 1C are plan views illustrating a semiconductor memory device practiced as a preferred first embodiment of the present invention.
Figure 1B:
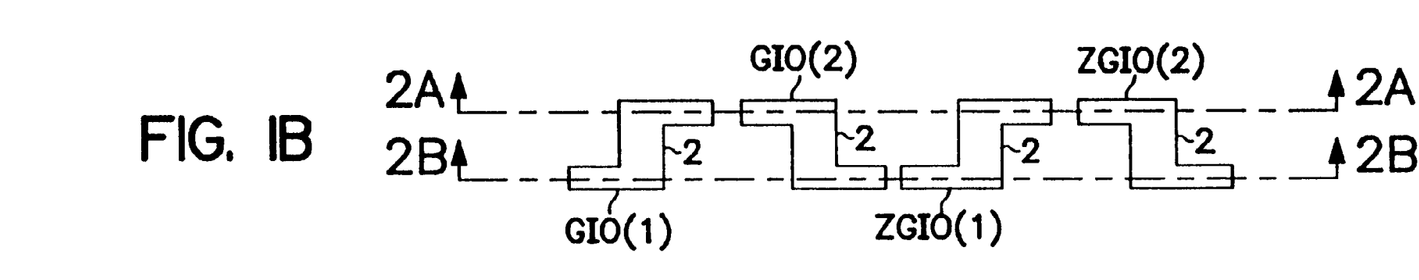
Figure 1C:
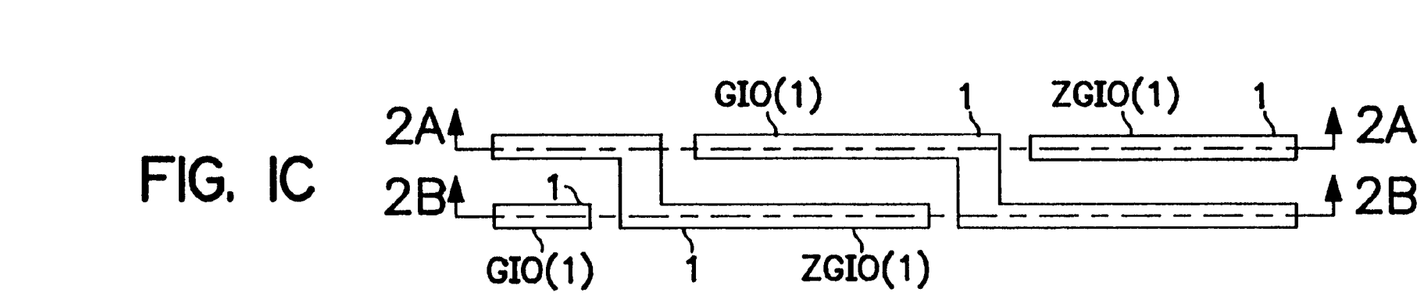

Referring to FIGS. 1A through 1C, there are shown plan views illustrating a semiconductor memory device practiced as a preferred first embodiment of the invention. To be more specific, FIG. 1A is a wiring diagram illustrating a third wiring layer. FIG. 1B is a wiring diagram illustrating a second wiring layer. FIG. 1C is a wiring layer illustrating a first wiring diagram. These drawings show common complementary data line pairs, namely, global I/O line pairs, which are connected through a selector switch to a bit line connected to a plurality of memory cells. In these drawings, reference numeral 1 denotes the first wiring layer, reference numeral 2 denotes the second wiring layer, and reference numeral 3 denotes the third wiring layer.

Figure 2A:
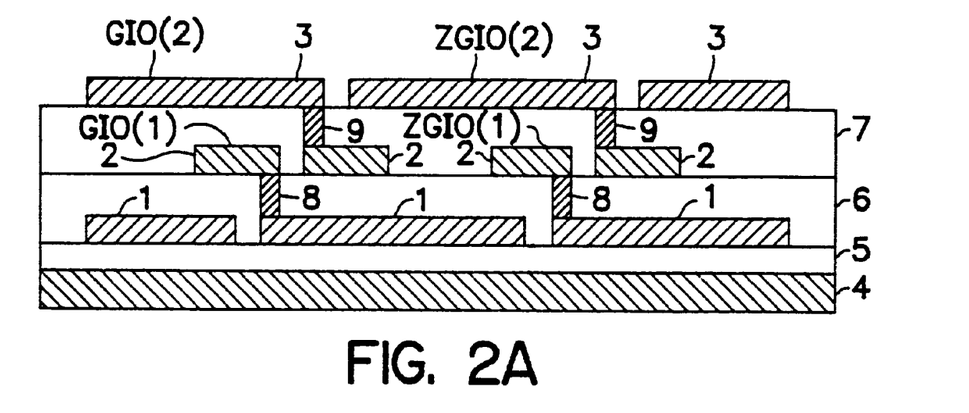
FIGS. 2A and 2B are cross sectional views illustrating the semiconductor memory device practiced as the preferred first embodiment of the present invention.
Figure 2B:
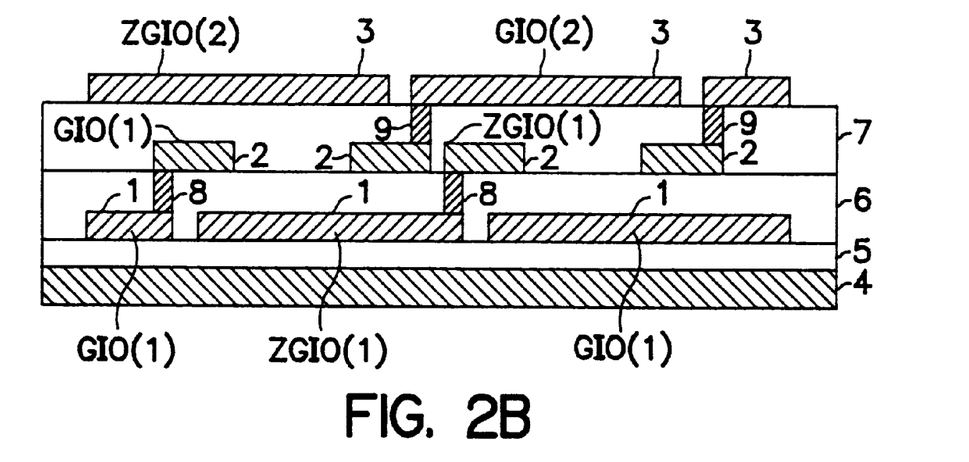

Referring to FIG. 2A, there is shown a cross sectional view illustrating the above-mentioned preferred first embodiment along line 2A—2A of FIGS. 1A through 1C. Referring to FIG. 2B, there is shown a cross sectional view illustrating the above-mentioned preferred first embodiment along line 2B—2B for FIGS. 1A through 1C. In FIGS. 2A and 2B, reference numeral 4 denotes a semiconductor substrate, reference numeral 5 denotes an insulation layer such as a field oxide film, reference numeral 6 denotes a first inter-layer insulation layer, reference numeral 7 denotes a second inter-layer insulation layer, reference numeral 8 denotes a first via contact for connecting the first wiring layer to the second wiring layer, and reference numeral 9 denotes a second via contact for connecting the second wiring layer to the third wiring layer. With reference to other portions, components similar to those previously described with reference to FIGS. 1A through 1C are denoted by the same reference numerals. A difference from a conventional example (shown in FIGS. 13 to 15) lies in that the three wiring layers 1 through 3 are used instead of a single wiring layer.

Figure 3:
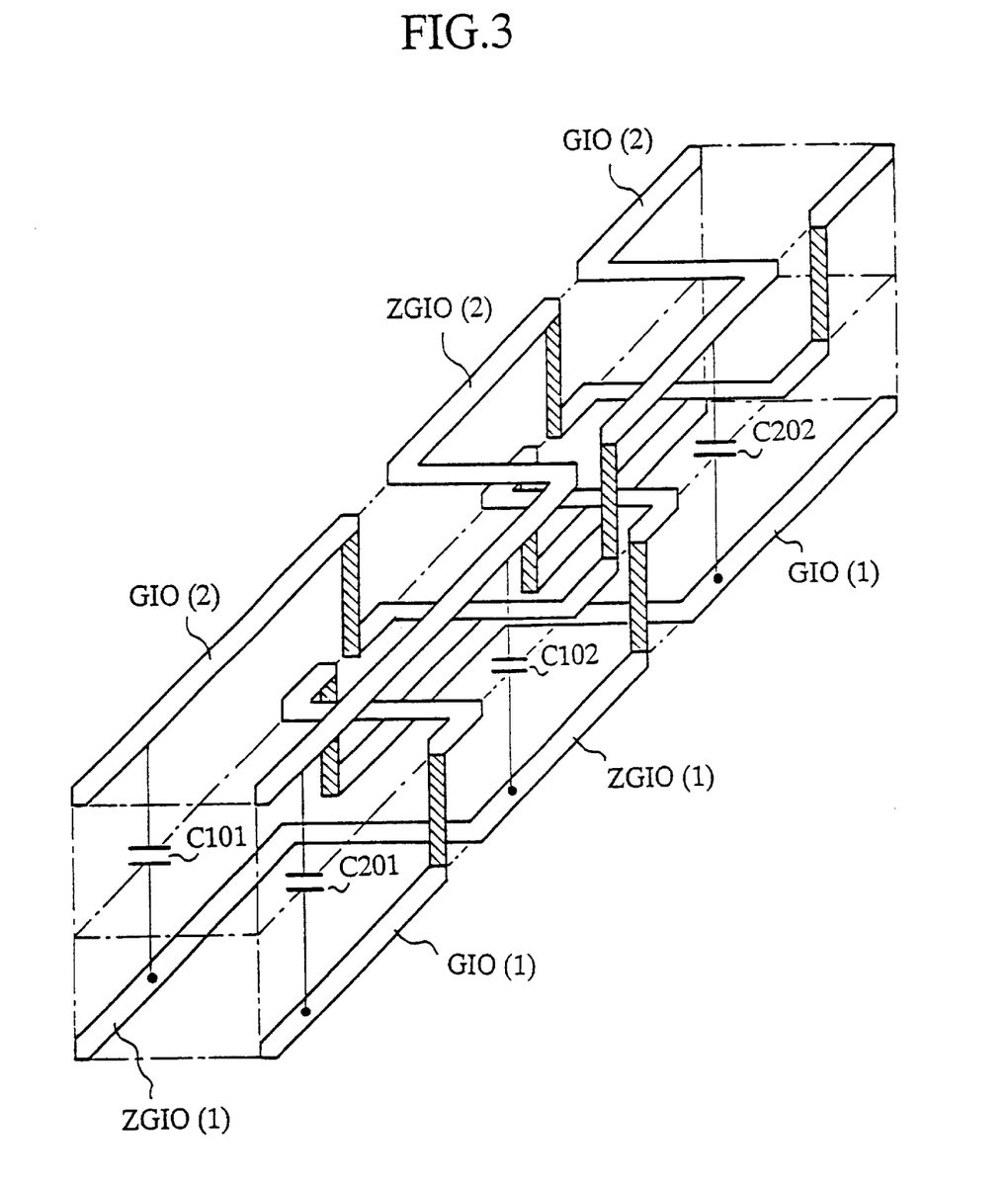
FIG. 3 is a perspective view illustrating the semiconductor memory device practiced as the preferred first embodiment of the present invention.

Referring to FIG. 3, there is shown a three-dimensional wiring diagram illustrating the semiconductor memory device practiced as the preferred first embodiment. In the drawing, C101 denotes a coupling capacitor between a global I/O bar line ZGIO(1) of a global I/O line pair (1) and a global I/O line GIO(2) of a global I/O line pair (2). C102 denotes a coupling capacitor between the global I/O bar line ZGIO(1) of the global I/O line pair (1) and a global I/O bar line ZGIO(2) of the global I/O line pair (2). C201 denotes a coupling capacitor between the global I/O line GIO(1) of the global I/O line pair (1) and the global I/O bar line ZGIO(2) of the global I/O line pair (2). C202 denotes a coupling capacitor between the global I/O line GIO(1) of the global I/O line pair (1) and the global I/O line GIO(2) of the global I/O line pair (2).

This constitution implements equivalent provision of the coupling capacitor C202 connected between the bit line of the global I/O line pair (1) using the first wiring layer and the bit line of the global I/O line pair (2) using the third wiring layer and the coupling capacitor C201 connected between the bit line of the global I/O line pair (1) using the first wiring layer and the bit bar line of the global I/O line pair (2) using the third wiring layer. In addition, the above-mentioned constitution implements equal provision of the coupling capacitor C101 connected between the bit bar line of the global I/O line pair (1) using the first wiring layer and the bit line of the global I/O line pair (2) using the second wiring layer and the coupling capacitor C102 connected between the bit bar line of the global I/O line pair (1) using the first wiring layer and the bit bar line of the global I/O line pair (2) using the third wiring layer.

Figure 4:
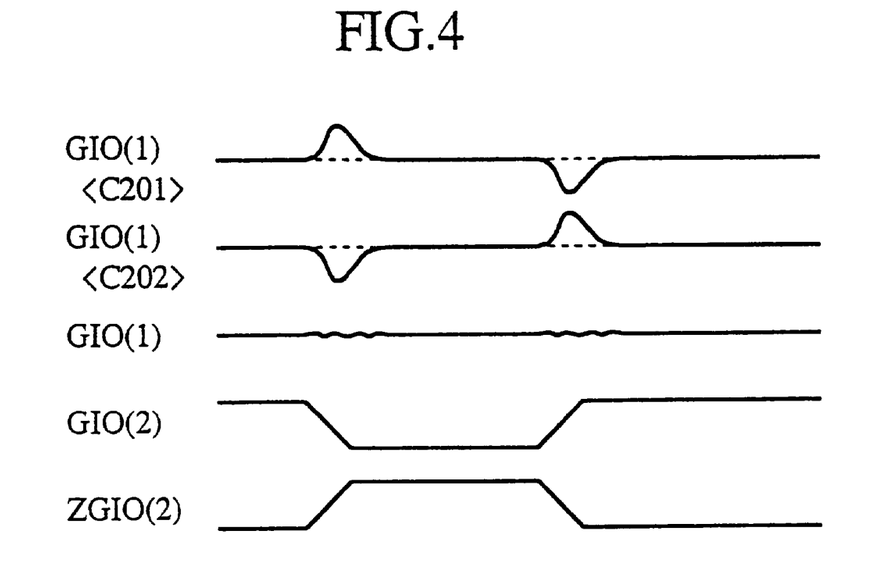
FIG. 4 is a diagram illustrating a correlation between wiring potentials of the semiconductor memory device practiced as the preferred first embodiment of the present invention.

Referring to FIG. 4, there is shown a diagram illustrating an influence of the coupling capacitors C201 and C202 connected with the bit line GIO(L) of the global I/O line pair (1), the bit line GIO(2) of the global I/O line pair (2), and the bit bar line ZGIO(2) to be given to the potentials. The bit line GIO(1) of the global I/O line pair (1) has the coupling capacitor 202 connected with the bit line GIO(2) of the global I/O line pair (2) and the coupling capacitor C201 connected with the bit bar line of the global I/O line pair (2).

The following describes the operation of the above-mentioned constitution.

When the potential level of the bit line GIO(2) of the global I/O line pair (2) changes from low to high, the potential of the bit line GIO(1) of the global I/O line pair (1) is raised by the coupling capacitor C202. However, at the same time, the level of the bit bar line ZGIO(2) of the global I/O line pair (2) changes from high to low, which lowers the potential the bit line GIO(1) of the global I/O line pair (1) by the coupling capacitor C201, thereby mitigating the influence to the bit line GIO(1) of the global I/O line pair (1). Likewise, the coupling capacitor C101 between the bit bar line ZGIO(1) of the global I/O line pair (1) and the bit line GIO(2) of the global I/O line pair (2) and the coupling capacitor C102 between the bit bar line ZGIO(1) of the global I/O line pair (1) and the bit bar line ZGIO(2) of the global I/O line pair (2) provide the same effect as described above.

At the same time, the first wiring layer provides the bit line (bit bar line) of the global I/O line pair (1) and the third wiring layer provides the bit line (bit bar line) of the global I/O line pair (2), which allows the wiring in an area one half of the conventionally required area, thereby contributing to higher integration of the semiconductor memory device.

Thus, according to the preferred first embodiment, the bit line and the bit bar line of one of the two global I/O line pairs are crossed each other in a planar manner, thereby canceling the noise on the other pair. And the multilayer wiring constitution allows the layout area to be reduced by half as compared with the conventional layout area. In the above-mentioned preferred first embodiment, three layers are used for multilayer wiring. It will be apparent to those skilled in the art that the above-mentioned noise cancellation and layout area reduction can be achieved by wiring constitutions such as four layers, five layers, and so on.

EMBODIMENT 2

Figure 5A:
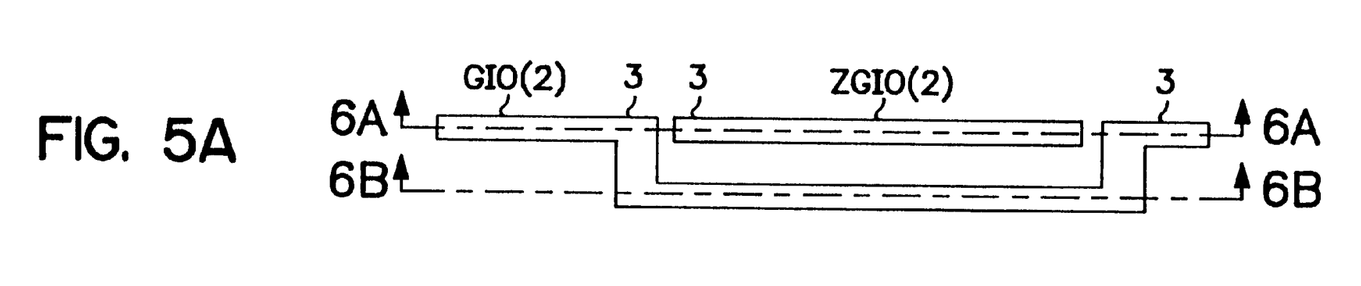
FIGS. 5A–5C is a plan view illustrating a semiconductor memory device practiced as a preferred second embodiment of the present invention.
Figure 5B:
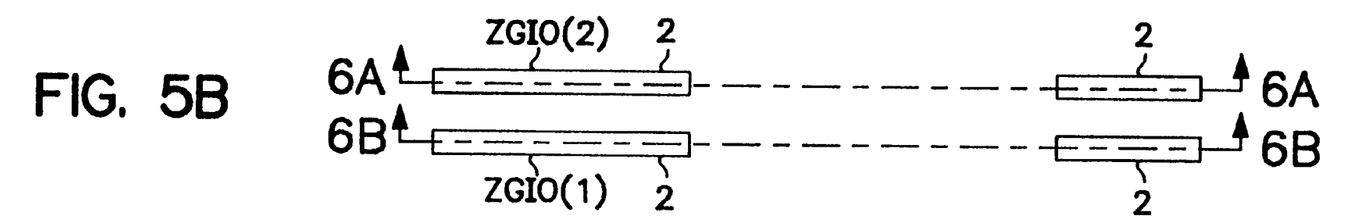
Figure 5C:
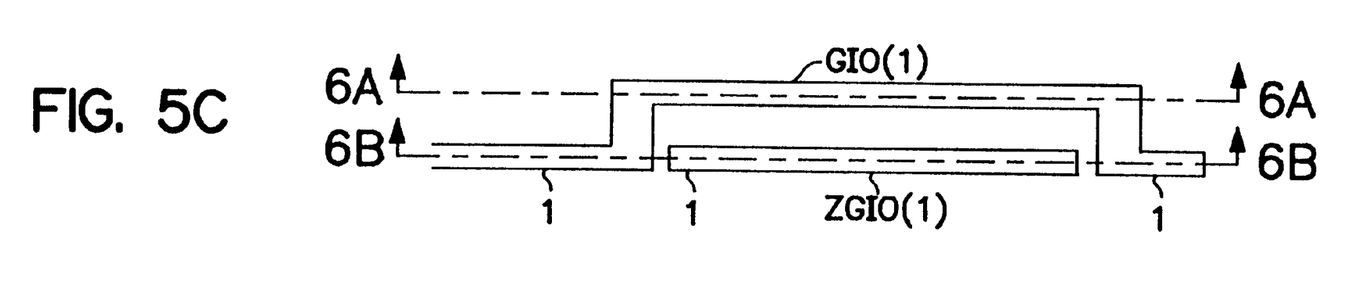

Referring to FIGS. 5A through 5C, there are shown plan views illustrating the semiconductor memory device practiced as a preferred second embodiment of the present invention. To be specific, FIG. 5A is a wiring diagram of a third wiring layer. FIG. 5B is a wiring diagram of a second wiring layer. FIG. 5C is a wiring diagram of a first wiring layer. In these drawings, reference numeral 1 denotes the first wiring layer, reference numeral 2 denotes the second wiring layer, and reference numeral 3 denotes the third wiring layer, showing a global I/O line pair to be connected by selecting through a selector switch a bit line connected to a plurality of memory cells. A difference from the conventional example (shown in FIGS. 13 through 15) lies in that the three wiring layers 1 through 3 are used instead of a single wiring layer.

Figure 6A:
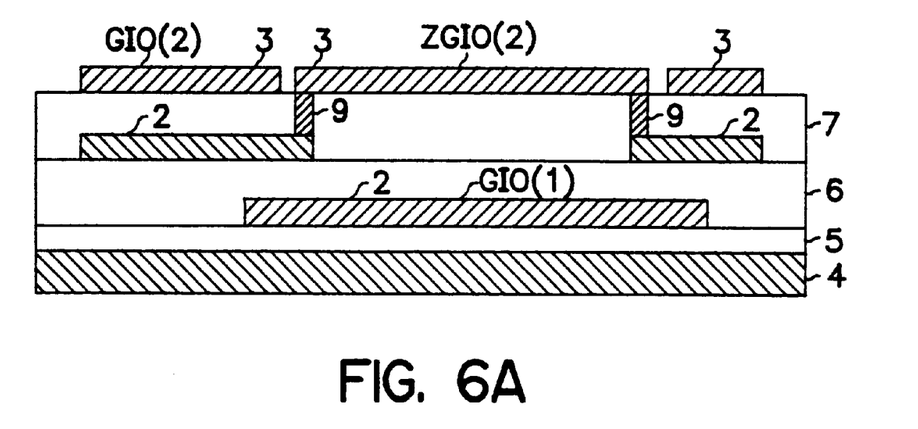
FIGS. 6A and 6B are cross sectional views illustrating the semiconductor memory device practiced as the preferred second embodiment of the present invention.
Figure 6B:
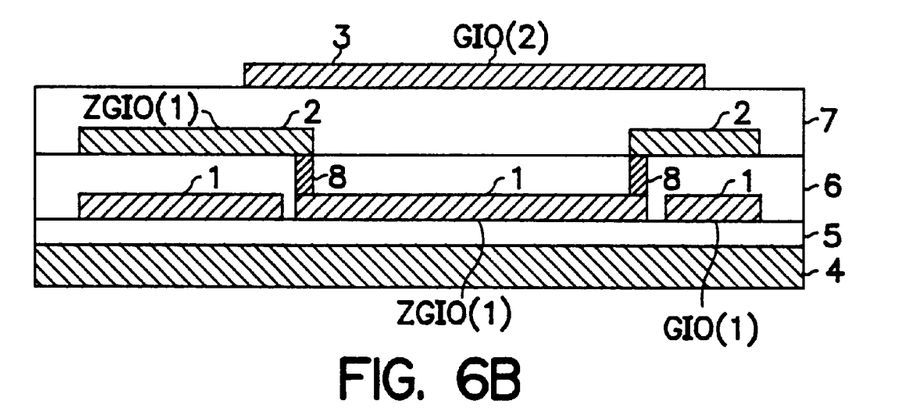

FIGS. 6A and 6B are cross sectional views illustrating cross sections of the preferred second embodiment shown in FIGS. 5A through 5C along line 6A—6A and line 6B—6B, respectively. In FIGS. 6A and 6B, reference numeral 4 denotes a semiconductor substrate, reference numeral 5 denotes an insulation layer such as a field oxide film, reference numeral 6 denotes a first interlayer insulation layer, reference numeral 7 denotes a second interlayer insulation layer, reference numeral 8 denotes a first via contact for connecting the first wiring layer to the second wiring layer, and reference numeral 9 denotes a second via contact for connecting the second wiring layer to the third wiring layer. With reference to other portions, components similar to those previously described with reference to FIGS. 5A through 5C are denoted by the same reference numerals.

Figure 7:
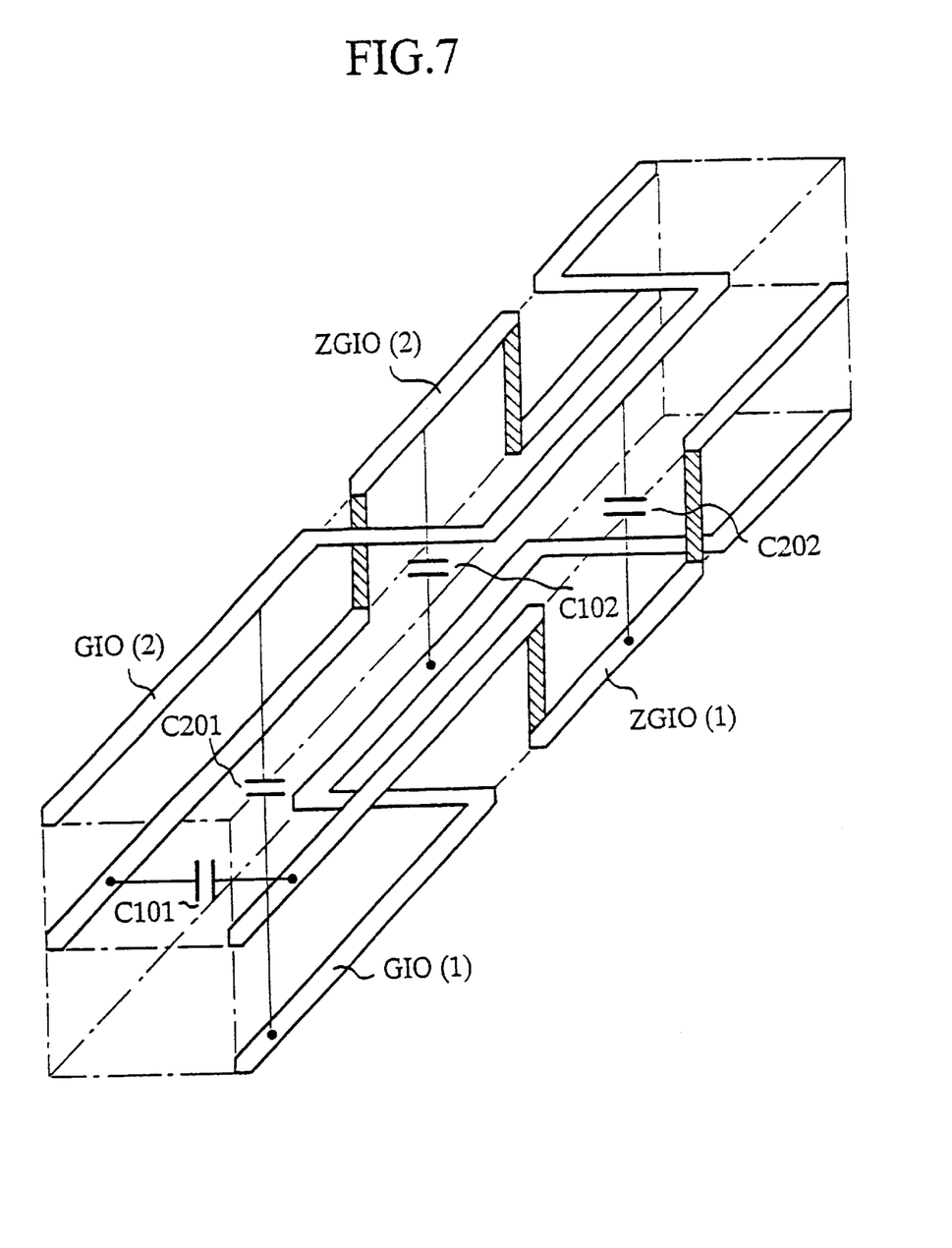
FIG. 7 is a perspective view illustrating the semiconductor memory device practiced as the preferred second embodiment of the present invention.

Referring to FIG. 7, there is shown a three-dimensional wiring diagram illustrating the semiconductor memory device practiced as the preferred second embodiment. In the drawing, a bit line GIO(1) of a global I/O line pair (1) using the first wiring layer can equivalently have a coupling capacitor C201 with a bit line GIO(2) of a global I/O line pair (2) using the third wiring layer and a coupling capacitor C102 with a bit bar line ZGIO(2) of the global I/O line pair (2) using the third wiring layer. In addition, the preferred second embodiment implements equivalent provision of a coupling capacitor C202 between the bit bar line ZGIO(1) of the global I/O line pair (1) using the first wiring layer and the bit line GIO(2) of the global I/O line pair (2) using the third wiring layer and a coupling capacitor C101 between the bit bar line ZGIO(1) of the global I/O line pair (1) using the first wiring layer and the bit bar line ZGIO(2) of the global I/O line pair (2) using the third wiring layer (or the second wiring layer).

Figure 8:
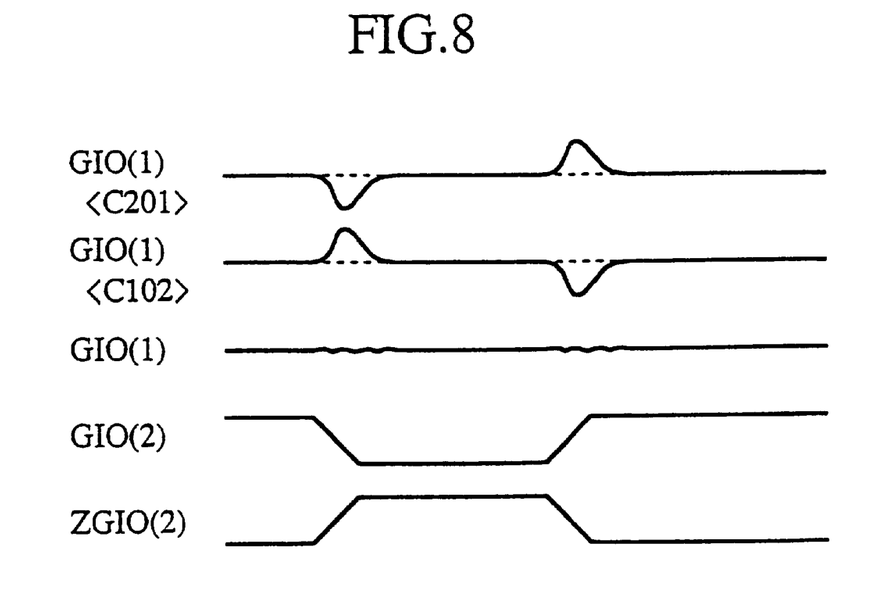
FIG. 8 is a diagram illustrating a correlation between wiring potentials of the semiconductor memory device practiced as the preferred second embodiment of the present invention.

Referring to FIG. 8, there is shown a diagram illustrating an influence to be given by the bit line GIO(1) of the global I/O line pair (1) to the potentials relative to the coupling capacitors (C201 and C102) the bit line GIO(2) and the bit bar line ZGIO(2) of the global I/O line pair (2). The bit line GIO(1) of the global I/O line pair (1) has the coupling capacitor C201 connected with the bit line GIO(2) of the global I/O line pair (2) and the coupling capacitor C102 connected with the bit bar line of the global I/O line pair (2).

The following describes the operation of the preferred second embodiment.

When the potential of the bit line GIO(2) of the global I/O line pair (2) changes from low to high, the bit line of the potential of the global I/O line pair (1) is increased by the coupling capacitor C201. However, at the same time, the potential of the bit bar line ZGIO(2) of the global I/O line pair (2) changes from high to low, which lowers the potential of the bit line of the global I/O line pair (1) by the coupling capacitor C102, thereby mitigating the influence to the bit line GIO(1) of the global I/O line pair (1).

Likewise, the coupling capacitor C202 between the bit bar line ZGIO(1) of the global I/O line pair (1) and the bit line GIO(2) of the global I/O line pair (2) and the coupling capacitor C101 between the bit bar line ZGIO(1) of the global I/O line pair (1) and the bit bar line ZGIO(2) of the global I/O line pair (2) provide the same effect as described above. At the same time, the cubic constitution with the first wiring layer providing the bit line GIO(1) (bit bar line ZGIO(1)) of the global I/O line pair (1) and the third wiring layer providing the bit line GIO(2) (bit bar line ZGIO(2)) of the global I/O line pair (2) allows wiring in a chip occupation area one half of that of the conventional constitution.

Thus, according to the preferred second embodiment, the bit line and the bit bar line of one of the two global I/O line pairs are crossed each other in a layered manner, thereby canceling the noise on the other pair. And the multilayer wiring constitution allows the layout area to be reduced by half as compared with the conventional layout area.

EMBODIMENT 3

Figure 9A:
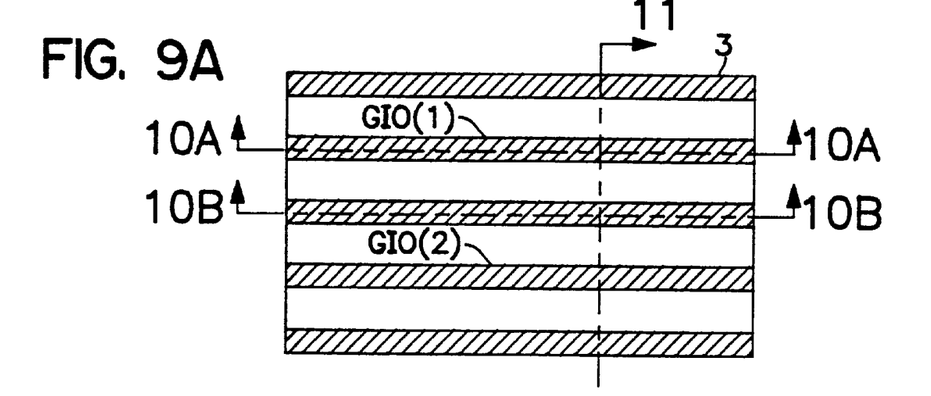
FIGS. 9A through 9C are plan views illustrating a semiconductor memory device practiced as a preferred third embodiment of the present invention.
Figure 9B:
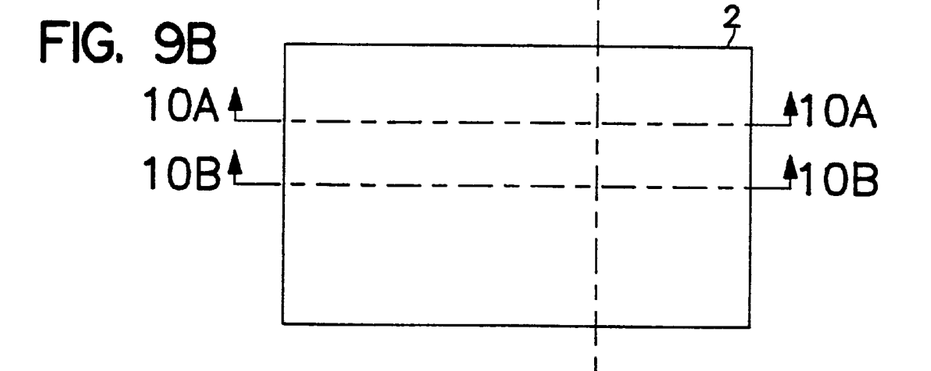
Figure 9C:
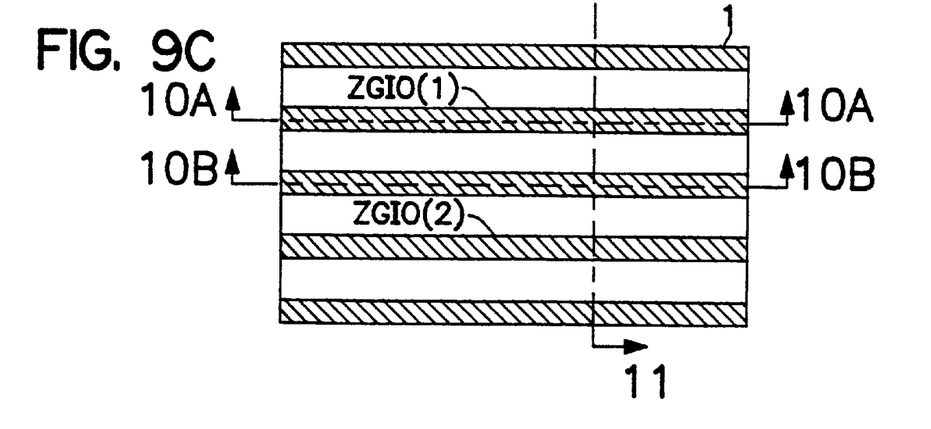

Referring to FIGS. 9A through 9C, there are shown plan views illustrating the semiconductor memory device practiced as a preferred third embodiment of the present invention. To be specific, FIG. 9A is a wiring diagram of a third layer. FIG. 9B is a wiring diagram of a second wiring layer used as a shield wall. FIG. 9C is a wiring diagram of a first wiring layer. A combination of these wirings shows global I/O line pairs to be connected by selecting through a selector switch a bit line connected to a plurality of memory cells. In these drawings, reference numeral 1 denotes the first wiring layer, reference numeral 2 denotes the second wiring layer, and reference numeral 3 denotes the third wiring layer. A difference from the conventional constitution (FIGS. 13 through 15) lies in that three wiring layers 1 through 3 are used instead of a single wiring layer.

Figure 10A:
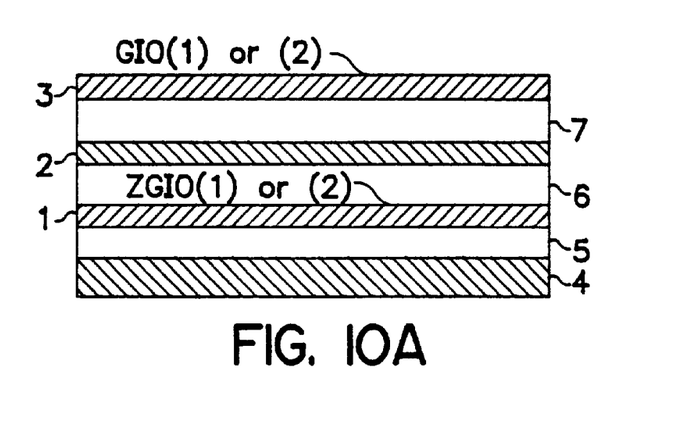
FIGS. 10A and 10B are cross sectional views illustrating the semiconductor memory device practiced as the preferred third embodiment of the present invention.
Figure 10B:
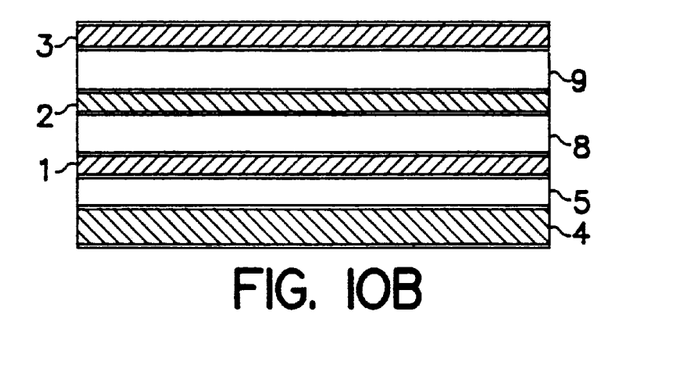
Figure 11:
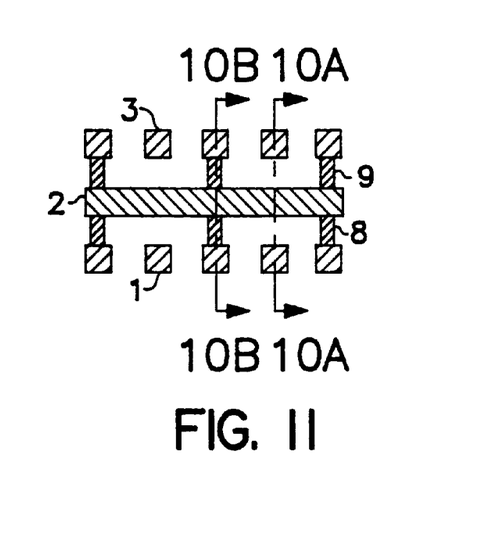
FIG. 11 is a cross sectional view illustrating the semiconductor memory device practiced as the third preferred embodiment of the present invention.

FIGS. 10A and 10B are cross sectional views illustrating the preferred third embodiment along lines 10A—10A and 10B—10B, respectively in FIGS. 9A through 9C. FIG. 11 is a cross sectional view illustrating the preferred third embodiment along line 11—11 of FIGS. 9A through 9C. In these drawings, reference numeral 4 denotes a semiconductor substrate, reference numeral 5 denotes an insulation layer such as a field oxide film, reference numeral 6 denotes a first inter-layer insulation layer, reference numeral 7 denotes a second inter-layer insulation layer, reference numeral 8 denotes a first via contact for connecting the first wiring layer to the second wiring layer, and reference numeral 9 denotes a second via contact for connecting the second wiring layer to the third wiring layer. With reference to other portions, components similar to those previously described with reference to FIGS. 9A through 9C are denoted by the same reference numerals. A difference from the conventional example lies in that three wiring layers 1 through 3 are used like the above-mentioned preferred first and second embodiments rather than a single wiring layer.

The conventional example uses a constitution in which a coupling capacitor for wiring can be provided with a particular bit line (or a bit bar line), so that the wiring is affected by a potential variation of other wiring. According to the preferred third embodiment of the present invention, a shield wall provided by the first through third wiring layers interconnected with the second wiring layer connected to a reference voltage (for example, ground level) at the center of these wiring layers is arranged between the bit line (or the bit bar line) of the global I/O line pair (1) using the first and third wiring layers and the bit line (or the bit bar line) of the global I/O tine pair (2) using the first and third wiring layers. This eliminates the coupling capacitor between the signal wirings and therefore each signal wiring has a coupling capacitor with the reference voltage. This constitution totally eliminates the influence due to the potential variation of each signal wiring. This constitution poses a problem of increased chip occupation area due to the provision of the shield wall using the first through third wiring layers. Still, this constitution is advantageous for a circuit that handles an infinitesimal potential as semiconductor memory devices come to operate on lower voltages.

Thus, according to the preferred third embodiment of the present invention, a shield wall using the first and third wiring layers is arranged between the two global I/O line pairs to eliminate the coupling capacitor between the signal wirings, thereby making the present invention applicable to a circuit that handles an infinitesimal potential as semiconductor memory devices come to operate on lower voltages.

While the preferred embodiments of the present invention have been described using specific terms, such description is for illustrative purposes only, and it is to be understood that changes and variations may be made without departing from the spirit or scope of the appended claims.

What is claimed is:

1. A semiconductor memory device comprising:

a complementary data line composed of a bit line connected to a plurality of memory cells and an inverted bit line;

a first wiring layer, a second wiring layer, and a third wiring layer sequentially formed on a semiconductor substrate;

a first common complementary data line pair including a bit line and an inverted bit line with said first wiring layer connected to said second wiring layer by a first via contact;

a second common complementary data line pair composed of a bit line and an inverted bit line with said second wiring layer connected to said third wiring layer by a second via contact; and a selector switch for selecting said bit line and said inverted bit line of said complementary data line to connect said bit line and said inverted bit line of said complementary data line to said bit lines and said inverted bit lines of said first and second common complementary data line pairs, wherein, when said first wiring layer provides said bit line of said first common complementary data line pair and said third wiring layer provides the bit line of said second common complementary data line pair, said second wiring layer makes an overlapped area between said bit line and said inverted bit line of said second common complementary data line pair equal to said bit line of said first common complementary data line pair and an overlapped area between said bit line and said inverted bit line of said first common complementary data line pair equal to said bit line of said second common complementary data line pair.

2. The semiconductor memory device according to claim 1, wherein, when said first wiring layer provides said inverted bit line of said first common complementary date line pair and said third wiring layer provides said inverted bit line of said second common complementary data line pair, said second wiring layer makes the overlapped area between the bit line and said inverted bit line of said second common complementary data line pair equal to said inverted bit line of said first common complementary data line pair and the overlapped area between the bit line and said inverted bit line of said first common complementary data line pair equal to said inverted bit line of said second common complementary data line pair.

3. The semiconductor memory device according to claim 1, further comprising a fourth wiring layer, a fifth wiring layer, and sixth wiring layer each having generally the same configuration as each of said first wiring layer, said second wiring layer, and said third wiring layer.

4. A semiconductor memory device comprising:
   a complementary data line composed of a bit line connected to a plurality of memory cells and an inverted bit line;
   a first wiring layer, a second wiring layer, and a third wiring layer sequentially formed on a semiconductor substrate;
   a first common complementary data line pair composed of a bit line with said first wiring layer connected to said second wiring layer through a first via contact and an inverted bit line formed by said first wiring layer;
   a second common complementary data line pair composed of a bit line with said second wiring layer connected to said third wiring layer through a second via contact and an inverted bit line formed by said third wiring layer; and
   a selector switch for selecting said bit line and said inverted bit line of said complementary data line to connect said bit line and said inverted bit line of said complementary data line to said bit lines and said inverted bit lines of said first and second common complementary data line pairs, wherein said first wiring layer and said second wiring layer make an overlapped area between said bit line and said inverted bit line of said first common complementary data line pair and an area in which said bit line and said bit bar line are parallel to each other equal to said bit line of the said second common complementary data line pair and said second wiring layer and said third wiring layer make an overlapped area between said bit line and said inverted bit line of said second common complementary data line pair and an area in which said bit line and said bit bar line are parallel to each other equal to the bit line of said first common complementary data line pair.

5. The semiconductor memory device according to claim 4, wherein said bit line and said inverted bit line are exchanged with each other.

6. The semiconductor memory device according to claim 4, further comprising a fourth wiring layer, a fifth wiring layer, and sixth wiring layer each having generally the same configuration as each of said first wiring layer, said second wiring layer, and said third wiring layer.

7. A semiconductor memory device comprising:
   a complementary data line composed of a bit line connected to a plurality of memory cells and an inverted bit line;
   a first wiring layer, a second wiring layer, and a third wiring layer formed on a semiconductor substrate;
   a first common complementary data line pair with a bit line and an inverted bit line allocated to said first wiring layer and a third wiring layer;
   a second common complementary data line pair with a bit line and an inverted bit line allocated to said first wiring layer and a third wiring layer; and
   a selector switch for selecting said bit line and said inverted bit line of said complementary data line to connect said bit line and said inverted bit line of said complementary data line to said bit lines and said inverted bit lines of said first and second common complementary data line pairs, wherein, when said first wiring layer is allocated to said bit lines of said first common complementary data line pair and said second common complementary data line pair and said third wiring layer is allocated to said inverted bit lines of said first common complementary data line pair and said second common complementary data line pair, at least one of said first wiring layer and said third wiring layer that do not provide said bit line and said bit bar line is connected to said second wiring layer through a contact.

8. The semiconductor memory device according to claim 7, wherein, when said first wiring layer is allocated to said inverted bit lines of said first common complementary data line pair and said second common complementary data line pair and said third wiring layer is allocated to the bit lines of said first common complementary data line pair and said second common complementary data line pair, at one of said first wiring layer and said third wiring layer that do not provide said bit line and said inverted bit line is connected to said second wiring layer through a contact.

9. The semiconductor memory device according to claim 7, wherein, when said first wiring layer is allocated to said bit line of said first common complementary data line pair and said inverted bit line of said second common complementary data line pair and said third wiring layer is allocated to said inverted bit line of said first common complementary data line pair and said bit line of said second common complementary data line pair, at least one of said first wiring layer and said third wiring layer that do not provide said bit line and said inverted bit line is connected to said second wiring layer through a contact.

10. The semiconductor memory device according to claim 7, further comprising a fourth wiring layer, a fifth wiring layer, and sixth wiring layer each having generally the same configuration as each of said first wiring layer, said second wiring layer, and said third wiring layer.

* * * * *